(12) United States Patent
Zhang

(10) Patent No.: US 9,866,214 B2
(45) Date of Patent: Jan. 9, 2018

(54) COMPOSITE DEVICE AND SWITCHING POWER SUPPLY

(71) Applicant: HANGZHOU SILAN MICROELECTRONICS CO., LTD., Zhejiang (CN)

(72) Inventor: Shaohua Zhang, Zhejiang (CN)

(73) Assignee: HANGZHOU SILAN MICROELECTRONICS CO., LTD., Zhejiang (CN)

( * ) Notice: Subject to any disclaimer, the term of this patent is extended or adjusted under 35 U.S.C. 154(b) by 0 days.

(21) Appl. No.: 15/305,014

(22) PCT Filed: Apr. 16, 2015

(86) PCT No.: PCT/CN2015/076735
§ 371 (c)(1),
(2) Date: Oct. 18, 2016

(87) PCT Pub. No.: WO2015/158276
PCT Pub. Date: Oct. 22, 2015

(65) Prior Publication Data
US 2017/0194958 A1   Jul. 6, 2017

(30) Foreign Application Priority Data
Apr. 18, 2014   (CN) .......................... 2014 1 0158196

(51) Int. Cl.
*H01L 27/088*   (2006.01)
*H03K 17/687*   (2006.01)

(52) U.S. Cl.
CPC ..... *H03K 17/6871* (2013.01); *H01L 27/0883* (2013.01)

(58) Field of Classification Search
CPC ........................... H01L 27/0883; H01L 29/10
See application file for complete search history.

(56) References Cited

U.S. PATENT DOCUMENTS 7,449,728 B2 * 11/2008 Wohlmuth ........ H01L 21/82345
257/155
9,385,186 B2 * 7/2016 Li ....................... H01L 29/7832
(Continued)

FOREIGN PATENT DOCUMENTS

CN   101159267 A   4/2008
CN   103000626 A   3/2013
(Continued)

OTHER PUBLICATIONS

International Search Report issued in corresponding PCT Application No. PCT/CN2015/076735 dated Jul. 20, 2015 (with partial English translation).

*Primary Examiner* — Patrick O'Neill
(74) *Attorney, Agent, or Firm* — Birch, Stewart, Kolasch & Birch, LLP

(57) ABSTRACT

This invention provides a composite device and a switching power supply. The composite device integrates therein a first enhancement-mode MOS device and a depletion-mode MOS device, and comprises: an epitaxial region of a first doping type; a first well region and a second well region formed in parallel on the front side of the epitaxial region; a first doped region of the first doping type formed within the first well region; a gate of the first enhancement-mode MOS device; a second doped region of the first doping type formed within the second well region; a channel region of the first doping type, wherein the channel region extends from a boundary of the second well region to a boundary of the second doped region; and a gate of the depletion-mode MOS device. The switching power supply includes the composite device above. This invention can decrease the process complexity, reduce the chip area and cost, and may be applicable to high power scenarios.

18 Claims, 12 Drawing Sheets

(56) References Cited

U.S. PATENT DOCUMENTS

2010/0066441 A1 3/2010 Liu
2017/0187275 A1* 6/2017 Lin .................... H02M 1/08

FOREIGN PATENT DOCUMENTS

CN 103928464 A 7/2014
CN 203787431 U 8/2014

* cited by examiner

COMPOSITE DEVICE AND SWITCHING POWER SUPPLY

TECHNICAL FIELD

This invention generally relates to techniques for semiconductor devices and switching power supplies, and more particularly to a composite device and a switching power supply.

BACKGROUND

Referring to FIG. 1, it shows a prior art of switching power supply 100 that is adapted to be AC-DC conversion and LED driving. The switching power supply 100 comprises a switching power supply control device 101, a resistor R1, and a power MOS device 102.

Still referring to FIG. 1, during the high-voltage startup of the switching power supply 100, a high-voltage terminal HV supplies a startup current to a power supply terminal VCC of the switching power supply control device 101 via the resistor R1, to finish the high-voltage startup of the switching power supply 100. After the high-voltage startup, the high-voltage terminal HV further supplies power to the power supply terminal VCC of the switching power supply control device 101 via the resistor R1. In operation, a drive terminal DRV of the switching power supply control device 101 drives a gate G of the high-voltage device 102, to provide a power driving output at a source S of the power device 102 or at the high-voltage terminal HV.

Referring to FIG. 2, it shows a schematic diagram of a layout 201 of the power device 102 within the switching power supply 100 in FIG. 1. The power device 102 is a high-voltage MOS device.

As shown in FIG. 1 and FIG. 2, on the layout 201 of the high-voltage MOS device 102, a bonding pad for the gate G and a bonding pad for the source S are located on a front side, and a bonding pad for the drain D is located on a back side. The three bonding pads may function to provide a power driving output of the high-voltage MOS device 102.

Referring to FIG. 3, it shows a longitudinal cross-sectional view along a direction AA' in FIG. 2.

As shown in FIG. 3, taking an N-type device as an example, the high-voltage MOS device includes: an N-type epitaxial region 306 of the MOS transistor, wherein the epitaxial region 306 is led out by an electrode 301 to form a drain of the MOS transistor; a P-well 302 of the MOS transistor; an N-type doped region 305 of the MOS transistor; a P-type doped region 309 of the MOS transistor, wherein the P-well 302, the P-type doped region 309 and the N-type doped region 305 are shorted via an electrode 303 to form a source of the MOS transistor; and a gate 304 of the MOS transistor. With regard to the whole structure of the device, the P-well 302, the N-type doped region 305, the P-type doped region 309 and the gate 304, etc., are formed in a cell portion 308. The cell portion 308 is a current conduction region of the device, and is an active region. The power device may be formed by a multitude of cell portions 308. There is a high-voltage ring 307 outside an edge of the cell portion 308. The high-voltage ring 307 may include a plurality of P-type doped regions 310, and may correspond to the region 207 shown in FIG. 2. The internal structure of the above device and the operation principles thereof are well known in the art, and will not be described in detail.

In connection with FIG. 1 and FIG. 3, the electrode 301 is coupled to the high-voltage terminal HV of the switching power supply 100, and the gate 304 is coupled to the driving terminal DRV of the switching power supply 100. When a voltage applied to the gate 304 is higher than a threshold voltage, the surface of the P-well 302 is inversed to form a channel, such that the source and the drain of the MOS transistor are electrically coupled to provide a power output.

In the scheme of FIG. 1, the high-voltage startup of the switching power supply 100 and the power supply for the supply terminal VCC of the switching power supply control device 101 are performed via the resistor R1. Since a current always flows through the resistor R1, there is a tradeoff between the startup time and the standby power consumption: if the resistance of the resistor R1 is small, during the high-voltage startup, the high-voltage terminal HV supplies a high current to the supply terminal VCC via the resistor R1, resulting a short startup time of the switching power supply 100, but after the high-voltage startup, the large current flowing through the resistor R1 causes high standby power consumption for the switching power supply 100; otherwise, if the resistance of the resistor R1 is large, during the high-voltage startup, the high-voltage terminal HV supplies a low current to the supply terminal VCC via the resistor R1, resulting a long startup time of the switching power supply 100, but after the high-voltage startup, the small current flowing through the resistor R1 causes low standby power consumption for the switching power supply 100.

To balance the startup time and the standby power consumption, in practice, the resistor R1 is generally chosen at an order of MΩ. Even so, when the voltage at the high-voltage terminal HV is at 220 VAC, the power consumption of the resistor R1 will be more than ten mW, up to hundreds of mW.

As above, the switching power supply 100 which performs the high-voltage startup of the switching power supply 100 and power supply for the supply terminal VCC of the switching power supply control device 101 via the resistor R1 in the prior art cannot both reduce the startup time, and decrease the standby power consumption.

For the problem above, there is proposed a solution in the prior art to add a depletion-mode device for startup, as shown in FIG. 4. On the basis of the existing switching power supply, the switching power supply 400 in FIG. 4 adds a high-voltage startup device 403 to expedite the high-voltage startup procedure of switching power supply 400, wherein the high-voltage startup device 403 is a depletion-mode MOS transistor. After the high-voltage startup, the high-voltage startup device 403 is turned off to reduce the standby power consumption of switching power supply 400, thereby improving the efficiency of the switching power supply 400.

In the prior art, the high-voltage startup device 403 is used as a separate device, primarily for high-voltage signal processing and control. Since the high-voltage startup device 403 is a separate device, the switching power supply 400 needs an extra component, which increases the complexity and cost of the system.

In view of the above problems, the Chinese patent application CN201210492874.4 proposes an integrated device, wherein a switching power supply control portion of a low voltage section is integrated with a high-voltage HVMOS section and a JFET, which may be achieved by a high-voltage BCD process. However, this scheme needs to be achieved by the high-voltage BCD process, such that the process for the whole chip is complex and costly. Moreover, due to the power consumption limitation of HVMOS devices in the high-voltage BCD process, this scheme can not be applied to high power scenarios.

SUMMARY

This invention intends to solve the problem of providing a composite device and a switching power supply, which help to decrease the process complexity, reduce the chip area and cost, and may be applicable to high power scenarios.

To address the technical problem above, this invention provides a composite device in which a first enhancement-mode MOS device and a depletion-mode MOS device are integrated, wherein the composite device comprises:

an epitaxial region of a first doping type, wherein the epitaxial region acts as drains of the first enhancement-mode MOS device and the depletion-mode MOS device;

a first well region and a second well region formed in parallel on a front side of the epitaxial region, wherein the first well region and the second well region have a second doping type opposite to the first doping type;

a first doped region of the first doping type formed within the first well region, wherein the first doped region acts as a source of the first enhancement-mode MOS device;

a gate of the first enhancement-mode MOS device formed on the front side of the epitaxial region, wherein the gate of the first enhancement-mode MOS device covers at least a portion of the first doped region and extends onto the epitaxial region outside the first well region;

a second doped region of the first doping type formed within the second well region, wherein the second doped region acts as a source of the depletion-mode MOS device;

a channel region of the first doping type located within the second well region, wherein the channel region extends from a boundary of the second well region to a boundary of the second doped region; and a gate of the depletion-mode MOS device formed on the front side of the epitaxial region, wherein the gate of the depletion-mode MOS device covers the channel region and extends onto the epitaxial region outside the second well region;

wherein the epitaxial region is shorted to a first electrode formed on a back side of the epitaxial region, the first well region and the first doped region are shorted via a second electrode, the second well region and the second doped region are shorted via a third electrode, wherein the second electrode and the third electrode are formed on the front side of the epitaxial region.

According to an embodiment of this invention, the composite device further comprises an isolator for isolating the first enhancement-mode MOS device from the depletion-mode MOS device, wherein the isolator comprises:

a floating well region of the second doping type, wherein the floating well region is formed in parallel with the first well region and the second well region on the front side of the epitaxial region, and the floating well region is located between the first well region and the second well region;

a first gate formed on the front side of the epitaxial region, wherein the first gate covers at least a portion of the floating well region and at least a portion of the first well region, the first gate further covers the epitaxial region between the floating well region and the first well region; and a second gate formed on the front side of the epitaxial region, wherein the second gate covers at least a portion of the floating well region and at least a portion of the second well region, and the second gate further covers the epitaxial region between the floating well region and the second well region;

wherein the first gate and the first well region are shorted, and the second gate and the second well region are shorted.

According to an embodiment of this invention, the first gate and the first well region are shorted via the second electrode, and the second gate and the second well region are shorted via the third electrode.

According to an embodiment of this invention, the composite device further comprises an isolator for isolating the first enhancement-mode MOS device from the depletion-mode MOS device, wherein the isolator comprises:

a floating well region of the second doping type, wherein the floating well region is formed in parallel with the first well region and the second well region on the front side of the epitaxial region, and the floating well region is located between the first well region and the second well region; and a dielectric layer formed on the front side of the epitaxial region, wherein the dielectric layer covers the floating well region and extends onto the epitaxial region outside the floating well region.

According to an embodiment of this invention, the composite device further comprises an isolator for isolating the first enhancement-mode MOS device from the depletion-mode MOS device, wherein the isolator comprises:

a floating well region of the second doping type, wherein the floating well region is formed in parallel with the first well region and the second well region on the front side of the epitaxial region, and the floating well region is located between the first well region and the second well region; and a second gate formed on the front side of the epitaxial region, wherein the second gate covers at least a portion of the floating well region and at least a portion of the second well region, and the second gate further covers the epitaxial region between the floating well region and the second well region, wherein the second gate and the second well region are shorted.

According to an embodiment of this invention, the second gate and the second well region are shorted via the third electrode.

According to an embodiment of this invention, the composite device further comprises an isolator for isolating the first enhancement-mode MOS device from the depletion-mode MOS device, wherein the isolator comprises:

a second gate formed on the front side of the epitaxial region, wherein the second gate covers at least a portion of the first well region and at least a portion of the second well region, and the second gate further covers the epitaxial region between the first well region and the second well region, wherein the second gate and the second well region are shorted.

According to an embodiment of this invention, the second gate and the second well region are shorted via the third electrode.

The composite device further comprises an isolator for isolating the first enhancement-mode MOS device from the depletion-mode MOS device, wherein the isolator comprises:

a first gate formed on the front side of the epitaxial region, wherein the first gate covers at least a portion of the first well region and at least a portion of the second well region, and the first gate further covers the epitaxial region between the first well region and the second well region, wherein the first gate and the first well region are shorted.

According to an embodiment of this invention, the first gate and the first well region are shorted via the second electrode.

According to an embodiment of this invention, the floating well region is formed with a same or different implantation process as the first well region and the second well region.

According to an embodiment of this invention, a second enhancement-mode MOS device is integrated in the composite device, wherein:

the epitaxial region acts as a drain of the second enhancement-mode MOS device;

a third well region is formed on the front side of the epitaxial region, wherein the third well region has the second doping type, and the third well region is parallel with the first well region and the second well region;

a third doped region of the first doping type is formed within the third well region, wherein the third doped region acts as a source of the second enhancement-mode MOS device;

a gate of the second enhancement-mode MOS device is formed on the front side of the epitaxial region, wherein the gate of the second enhancement-mode MOS device covers at least a portion of the third doped region and extends onto the epitaxial region outside the third well region, and the gate of the second enhancement-mode MOS device is electrically coupled to the gate of the first enhancement-mode MOS device;

wherein the third well region and the third doped region are shorted via a fourth electrode, which is formed on the front side of the epitaxial region.

According to an embodiment of this invention, the composite device further comprises:

a first leading-out region of the second doping type formed within the first well region, wherein the first leading-out region and the first doped region are shorted via the second electrode; and a second leading-out region of the second doping type formed within the second well region, wherein the second leading-out region and the second doped region are shorted via the third electrode.

According to an embodiment of this invention, the first enhancement-mode MOS device and the depletion-mode MOS device share a common high-voltage ring.

According to an embodiment of this invention, one or more first enhancement-mode MOS devices are integrated in the composite device, and one or more depletion-mode MOS devices are integrated in the composite device.

This invention further provides a switching power supply, comprising any one of the composite devices above.

According to an embodiment of this invention, the switching power supply comprises:

a switching power supply control device with a power supply terminal, a control terminal and a driving terminal;

the composite device, wherein the gate of the first enhancement-mode MOS device in the composite device is coupled to the driving terminal of the switching power supply control device, the gate of the depletion-mode MOS device in the composite device is coupled to the control terminal of the switching power supply control device, and the source of the depletion-mode MOS device in the composite device is coupled to the power supply terminal of the switching power supply control device.

According to an embodiment of this invention, when the power supply terminal has a voltage lower than a preset turn-off voltage, the switching power supply control device controls the depletion-mode MOS device in the composite device to supply a startup current to the power supply terminal; when the voltage at the power supply terminal rises above a preset turn-on voltage, the switching power supply control device controls the first enhancement-mode MOS device in the composite device to provide a power output current to a main circuit of the switching power supply, and controls the depletion-mode MOS device in the composite device to cut off the startup current.

As compared with the prior art, this invention has the following advantages:

In an embodiment of this invention, the enhancement-mode MOS device and the depletion-mode MOS device are integrated together in the composite device. In particular, a part of a conventional enhancement-mode MOS device is isolated, wherein an inversed channel region is added on a surface of the well region in the isolated region, such that the enhancement-mode MOS device and the depletion-mode MOS device are formed within the same epitaxial region. The composite device according to an embodiment of this invention does not need the complex high-voltage BCD process, but may be achieved by a conventional power MOS process, thereby reducing the process complexity and cost. Moreover, this solution is not substantially constrained in power consumption, and may be applicable to high power scenarios. Further, the composite device according to an embodiment of this invention further integrates therein an isolator isolating the enhancement-mode MOS device from the depletion-mode MOS device, thereby dramatically improving the withstand voltage between the well regions of adjacent enhancement-mode MOS device and depletion-mode MOS device, so as to meet the requirements for switching power supplies.

DETAILED DESCRIPTION

This invention is further described in conjunction with the following specific embodiments and the drawings, although the scope of this invention is not so limited.

Figure 1:
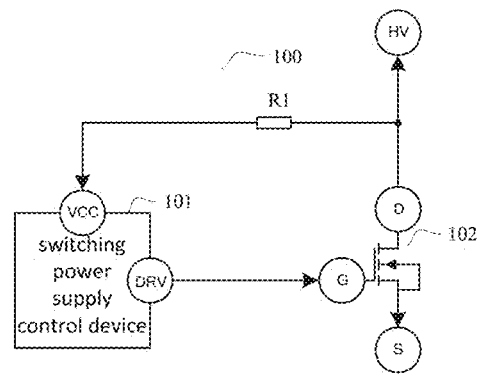
FIG. 1 is a circuit schematic diagram of a switching power supply in the prior art.
Figure 2:
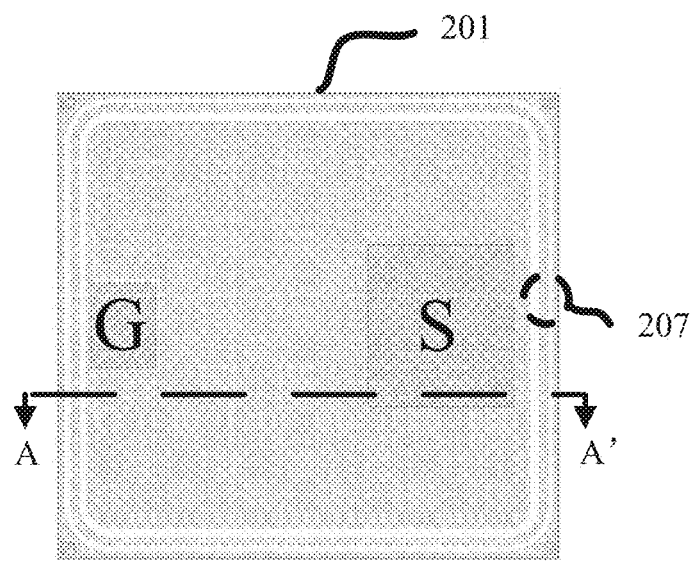
FIG. 2 is a layout schematic diagram of a high-voltage MOS device in the switching power supply shown in FIG. 1.
Figure 3:
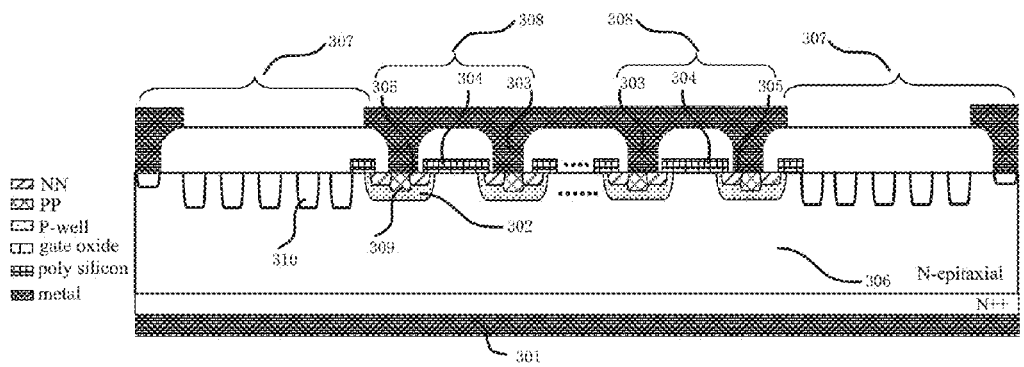
FIG. 3 is a cross-sectional view along a direction AA' in FIG. 2.
Figure 4:
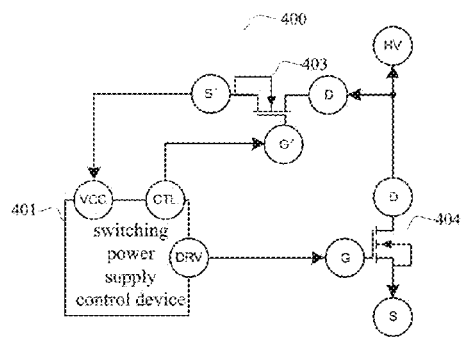
FIG. 4 is a circuit schematic diagram of an improved switching power supply in the prior art.
Figure 5:
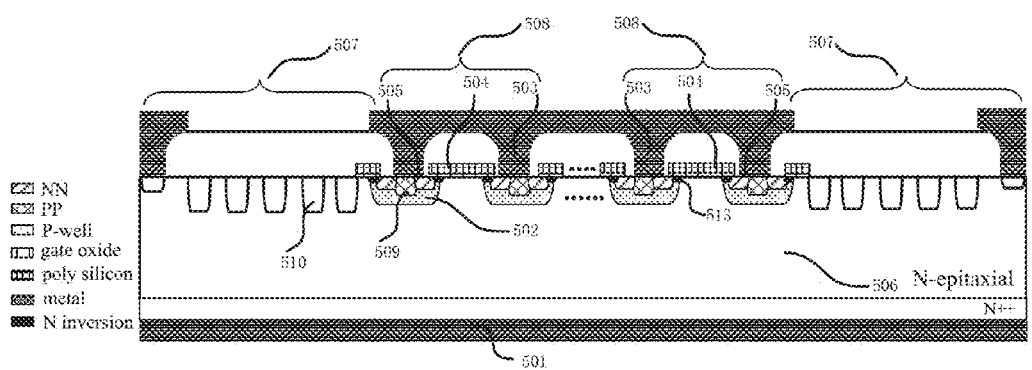
FIG. 5 is a cross-sectional view of a depletion-mode MOS device in the prior art.

An enhancement-mode MOS device in the prior art is shown in FIG. 3. A depletion-mode MOS device in the prior art is shown in FIG. 5, including a cell portion 508 and a high-voltage ring 507 on the periphery of the cell portion 508, wherein the cell portion 508 is an active region. Further, taking an N-type device as an example, the depletion-mode MOS device includes: an N-type doped epitaxial region 506, which is shorted to an electrode 501 to form a drain of the depletion-mode MOS device; a P-type well region 502; an N-type doped region 505 formed in the P-type well region 502; a P-type doped region 509 formed in the P-type well region 502, wherein the P-type doped region 509, the N-type doped region 505 and the P-type well region 502 are shorted via an electrode 503 to form a source of the depletion-mode MOS device; a gate 504 on the epitaxial region 506; an N-type channel region 513 located between the N-type doped region 505 and the P-type well region 502 and formed on a surface of the P-type well region 502. When the gate voltage is at zero volt, due to the presence the N-type channel region 513, a conductive channel is formed. When there is a voltage difference between the drain and the source, a current is formed between the drain and the source and flows out of the channel, so as to turn on the device. When the gate voltage is negative and lower than a threshold voltage of the depletion-mode MOS device, the N-type channel region 513 is inversed, and the channel is turned off, so as to turn off the device. When the device is turned off and a high voltage is applied to the drain, the depletion layers of the P-type well regions 502 within the cell portions 508 are coupled to each other to achieve a high withstand voltage. At the edge of the cell portion 508, since the curvature of the P-type well region 502 is decreased, it requires the high-voltage ring 507 to extend the depletion layer to endure the voltage applied on the drain, such that the device has a high reverse breakdown voltage and good reliability. The high-voltage ring 507 may include a plurality of P-type doped regions 510.

As can be seen from FIG. 3 and FIG. 5, the enhancement-mode MOS device and the depletion-mode MOS device are mostly similar in structure, except that a channel region 513 is added in the depletion-mode MOS device. In an embodiment of this invention, a part of the gate region and the source region is isolated in the enhancement-mode MOS device, wherein an inversed channel region is added on a surface of the P-type well region in the isolated region, such that the enhancement-mode MOS device and the depletion-mode MOS device may be formed within the same epitaxial region, so as to be integrated in the same composite device.

Further description is presented below in conjunction with various different embodiments.

First Embodiment

Figure 6:
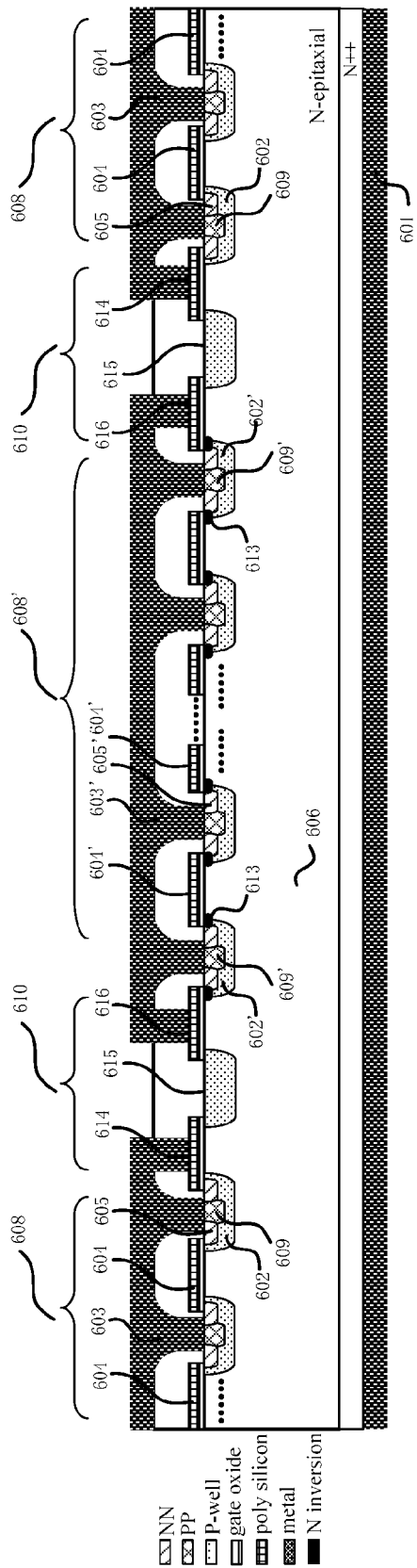
FIG. 6 is a cross-sectional view of a composite device according to a first embodiment of this invention.

Referring to FIG. 6, a composite device includes a cell portion 608 of a first enhancement-mode MOS device and a cell portion 608' of a depletion-mode MOS device, wherein both cell portions are active regions. Taking an N-type device as an example, the composite device may include: an N-type doped epitaxial region 606, wherein a first electrode 601 is located on a back side of the epitaxial region 606, and the epitaxial region 606 and the first electrode 601 are shorted to form a drain of the first enhancement-mode MOS device and the depletion-mode MOS device; P-type doped first well region 602 and second well region 602' formed on a front side of the epitaxial region 606; a first N-type doped region 605 formed in the first well region 602; a second N-type doped region 605' formed in the second well region 602'; an N-type doped channel region 613 within the second well region 602', wherein the channel region 613 extends from a boundary of the second well region 602' to a boundary of the second doped region 605'; a gate 604 of the first enhancement-mode MOS device formed on the front side of the epitaxial region 606, wherein the gate 604 of the first enhancement-mode MOS device covers at least a portion of the first doped region 605 and extends onto the epitaxial region 606 outside the first well region 602; a gate 604' of the depletion-mode MOS device formed on the front side of the epitaxial region 606, wherein the gate 604' of the depletion-mode MOS device covers the channel region 613 and extends onto the epitaxial region 606 outside the second well region 602'; a first P-type doped leading-out region 609 formed in parallel with the first doped region 605 within the first well region 602; and a second P-type doped leading-out region 609' formed in parallel with the second doped region 605' within the second well region 602'.

The first well region 602, the first leading-out region 609 and the first doped region 605 are shorted via a second electrode 603, to form a source of the first enhancement-mode MOS device. The second well region 602', the second leading-out region 609' and the second doped region 605' are shorted via a third electrode 603' to form a source of the depletion-mode MOS device.

As a non-limiting instance, the gate 604 of the first enhancement-mode MOS device and the gate 604' of the depletion-mode MOS device may each include a gate dielectric layer and a gate electrode on the gate dielectric layer. The gate electrode may be a polysilicon gate electrode, for example.

As a preferred embodiment, the composite device may also integrate therein an isolator 610 to isolate the first enhancement-mode MOS device from the depletion-mode MOS device. The isolator 610 may be located between the cell portion 608 of the first enhancement-mode MOS device and the cell portion 608' of the depletion-mode MOS device.

Still taking an N-type device as an example, the isolator 610 may include: a P-type doped floating well region 615, wherein the floating well region 615 is formed in parallel with the first well region 602 and the second well region 602' on the front side of the epitaxial region 606, and the floating well region 615 is located between the first well region 602 and the second well region 602'; a first gate 614 formed on the front side of the epitaxial region 606, wherein the first gate 614 covers at least a portion of the floating well region 615 and at least a portion of the first well region 602, the first gate 614 further covers the epitaxial region 606 between the floating well region 615 and the first well region 602; and a second gate 616 formed on the front side of the epitaxial region 606, wherein the second gate 616 covers at least a portion of the floating well region 615 and at least a portion of the second well region 602', and the second gate 616 further covers the epitaxial region 606 between the floating well region 615 and the second well region 602'. The first gate 614 and the first well region 602 are shorted, e.g., shorted via the second electrode 603, but are not so limited; the second gate 616 and the second well region 602' are shorted, e.g., shorted via the third electrode 603', but are not so limited.

The floating well region 615 may be formed by the same implantation process as the first well region 602 and the second well region 602'. The first gate 614 and the second gate 616 may each include a gate dielectric layer and a gate electrode on the gate dielectric layer. The gate electrode may be a polysilicon gate electrode, for example.

When the composite device operates, it requires that the gate 604 of the first enhancement-mode MOS device is independent from the gate 604' of the depletion-mode MOS device, the isolation withstand voltage thereof is determined by the withstand voltage of the gate dielectric layer, and may be more than 40V; and that the source of the enhancement-mode MOS device is independent from the source of the depletion-mode MOS device. Due to the presence of the floating well region 615, the isolation withstand voltage between the P-type well region 602 of the first enhancement-mode MOS device and the adjacent P-type well region 602' of the depletion-mode MOS device are increased greatly, up to more than 40V. The isolation withstand voltage can fully meet the requirements of a switching power supply control system.

When the composite device is turned off, the depletion layers of the P-type well region 602 of the first enhancement-mode MOS device, the well region 602' of the depletion-mode MOS device, and the floating well region 615 in the isolator 610 are coupled to each other. The inter-connection of the depletion layers has the same effect as the inter-connection of the depletion layers of the P-type well regions when the first enhancement-mode MOS device or the depletion-mode MOS device is turned off, and may endure a high withstand voltage.

Figure 7:
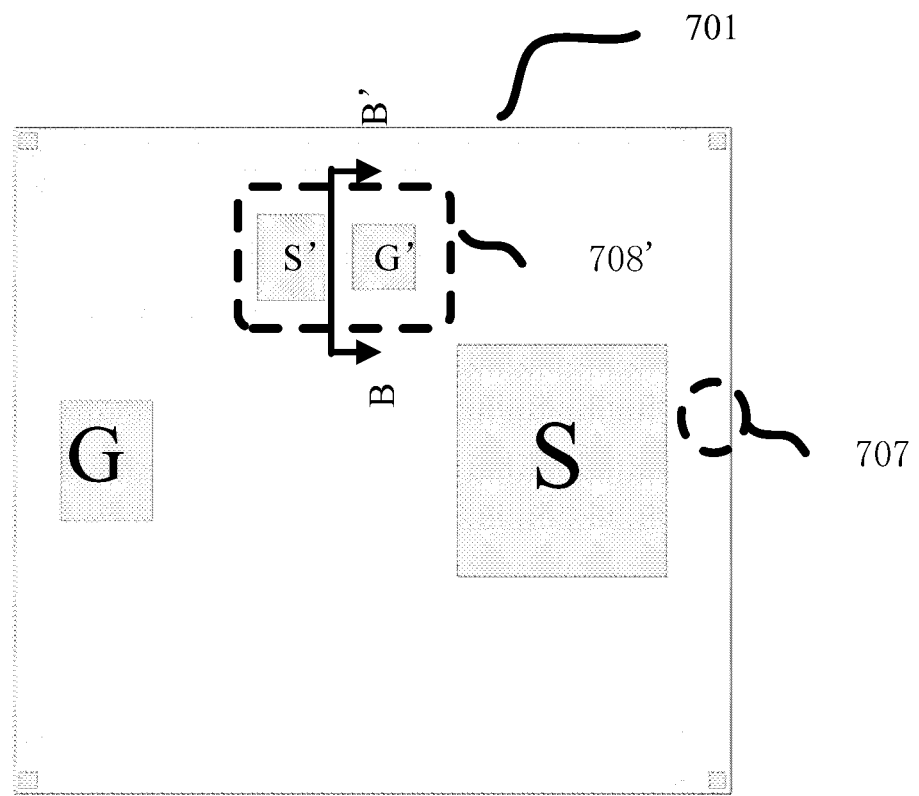
FIG. 7 is a layout schematic diagram of the composite device according to the first embodiment of this invention.

Referring to FIG. 7, it shows a layout 701 of the composite device according to the first embodiment. FIG. 6 is a cross-sectional view along a direction BB' of FIG. 7. On a front side of the layout 701, there are bonding pads for the source S and the drain G of the first enhancement-mode MOS device as well as bonding pads for the source S' and the gate G' of the depletion-mode MOS device. On a back side of the layout 701, there are the drains of the first enhancement-mode MOS device and the depletion-mode MOS device.

FIG. 7 shows a region 708', which is an active region or cell portion of the depletion-mode MOS device. The first enhancement-mode MOS device and the depletion-mode MOS device are located within a high-voltage ring 707, which may have a structure similar to the high-voltage ring of the enhancement-mode MOS device shown in FIG. 3 or the depletion-mode MOS device shown in FIG. 5.

Normally, the depletion-mode MOS device has a small current, and thus the active region 708' of the depletion-mode MOS device may have a relatively small area. However, the scope of this application is not limited in the area of the active region of the depletion-mode MOS device and the area of the active region of the enhancement-mode MOS device. According to the practical requirements, if a larger current is required for the depletion-mode MOS device, the area of the active region 708' may be increased in order to meet the practical requirements.

As above, with the scheme of the first embodiment, two independent enhancement-mode MOS device and depletion-mode MOS device may be integrated together in the same composite device. Since a high-voltage ring in a high-voltage device needs a large area, and the two devices in this embodiment may share a common high-voltage ring, the high-voltage ring for at least one device is omitted, thereby reducing the chip area and improving the chip integrity. Moreover, a process flow for the composite device is substantially the same as an enhancement-mode MOS device with the addition of an inversed channel region, and the process flow for the composite device is identical to the depletion-mode MOS, thus the chip process complexity and cost are reduced.

Figure 8:
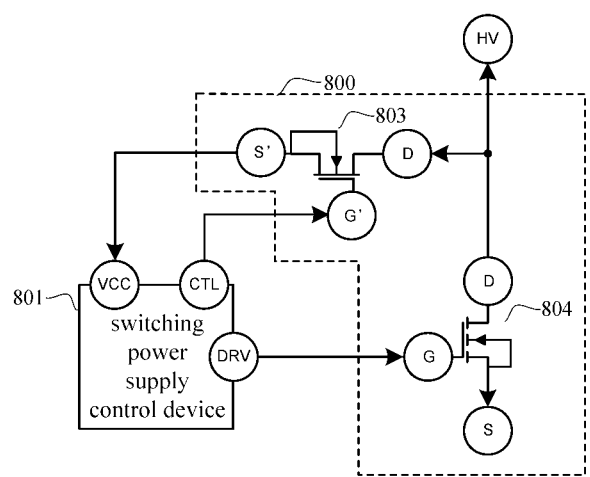
FIG. 8 is a circuit schematic diagram of a switching power supply according to a first embodiment of this invention.

Referring to FIG. 8, it shows a circuit structure of a switching power supply according to a first embodiment. The switching power supply includes a composite device 800 and a switching power supply control device 801. The composite device 800 is the composite device shown in FIG. 6 and FIG. 7. The composite device 800 includes an enhancement-mode MOS device 804 and a depletion-mode MOS device 803.

Further, the enhancement-mode MOS device 804 has a drain D coupled to a high-voltage terminal HV of the switching power supply, and the enhancement-mode MOS device 804 has a gate G coupled to a driving terminal DRV of the switching power supply control device 801. The depletion-mode MOS device 803 has a drain D' also coupled to the high-voltage terminal HV, and the depletion-mode MOS device 803 has a gate G; and a source S' coupled to a control terminal CTL and a power supply terminal VCC of the switching power supply control device 801, respectively.

When the power supply terminal VCC has a voltage lower than a preset turn-off voltage, the switching power supply control device 801 controls, via the control terminal CTL, the depletion-mode MOS device 803 in the composite device 800 to provide a startup current to the power supply terminal VCC, wherein the startup current will charge the power supply terminal VCC. When the voltage at the power supply terminal VCC rises above a preset turn-on voltage, the switching power supply control device 801 controls, via the driving terminal DRV, the first enhancement-mode MOS device 804 in the composite device 800 to provide a power output current to a main circuit of the switching power supply, and controls, via the control terminal CTL, the depletion-mode MOS device 803 in the composite device 800 to cut off the startup current.

More particularly, when the system starts up, the power supply terminal VCC of the switching power supply control device is not powered, and is at zero potential or near zero potential, thus output signals of the control terminal CTL and the driving terminal DRV are both at zero potential; the gate G' of the depletion-mode MOS device 803 is at zero potential, thus the depletion-mode MOS device 803 is turned on, and a current flows from the high-voltage terminal HV to the power supply terminal VCC, beginning to supply power to the power supply terminal VCC, then the voltages of the gate G' and the source S' of the depletion-mode MOS device 803 rise along with the power supply terminal VCC; when the voltage at the power supply terminal VCC rises to an operating voltage (e.g., generally higher than 12V), the depletion-mode MOS device 803 finishes the high-voltage startup process. At this point, the source S' and the gate G' of the depletion-mode MOS device 803 reach relatively high levels, thus the switching power supply control device 801 sets, via the control terminal CTL, the gate G' of the depletion-mode MOS device 803 to zero potential, generating a voltage between the gate G' and the source S' of the depletion-mode MOS device 803 lower than a threshold voltage, thereby turning off the depletion-mode MOS device 803. After the depletion-mode MOS device 803 is turned off, the switching power supply control device 801 starts normal operation, to drive the gate G of the enhancement-mode MOS device 804 via the driving terminal DRV (e.g., generally at 10~15V), thereby providing a power driving output at the source S of the enhancement-mode MOS device 804 or at the high-voltage terminal HV. When the voltage at the power supply terminal VCC decreases to a certain voltage due to power consumption, the driving terminal DRV will output a low level to turn off the enhancement-mode MOS device 804; thereafter, the control terminal CTL will set the gate G' of the depletion-mode MOS device 803 to a high level, such that the depletion-mode MOS device 803 is turned on, and restarts the high-voltage startup process.

As above, during operation, there will be a voltage difference between the source S and the source S', and between the gate G and the gate G', of the enhancement-mode MOS device 804 and the depletion-mode MOS device 803. This requires a certain isolation withstand voltage between the two sources and between the two gates of the composite device, otherwise the system may fail. The approach for isolation withstand voltage has been described above, and will not be repeated here.

Second Embodiment

Figure 9:
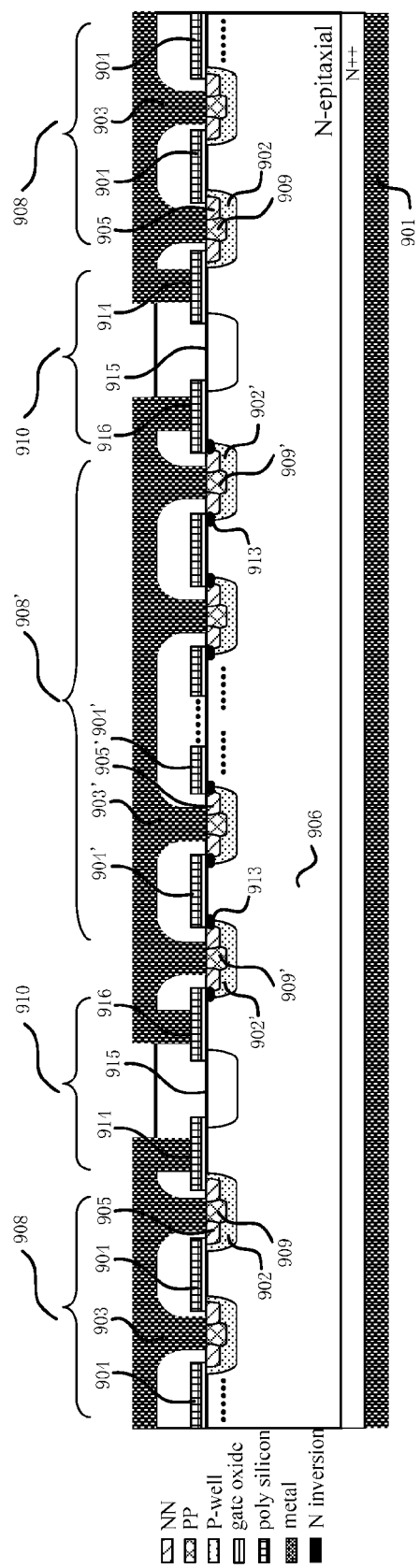
FIG. 9 is a cross-sectional view of a composite device according to a second embodiment of this invention.

Referring to FIG. 9, it shows a cross-sectional structure of a composite device according to a second embodiment. The composite device includes a cell portion 908 of a first enhancement-mode MOS device and a cell portion 908' of a depletion-mode MOS device, wherein both cell portions are active regions. The composite device according to the second embodiment is substantially the same as the first embodiment in structure, including an epitaxial region 906, a first electrode 901, a first well region 902, a first doped region 905, a first leading-out region 909, a second well region 902', a second doped region 905', a second leading-out region 909', a gate 904 of the first enhancement-mode MOS device, a gate 904' of the depletion-mode MOS device, a second electrode 903, a third electrode 903', and an isolator 910 which includes a floating well region 915, a first gate 914 and a second gate 916.

The second embodiment is mainly different from the first embodiment in that: the floating well region 915 is formed with an implantation process different from that for the first well region 902 and the second well region 902'. That is, different implantation processes may be employed in multiple steps to form the floating well region 915 separately from the first well region 902 and the second well region 902'. For example, the floating well region 915 may be formed by an implantation process for forming a voltage division ring or a dopant implantation process of other concentrations.

Third Embodiment

Figure 10:
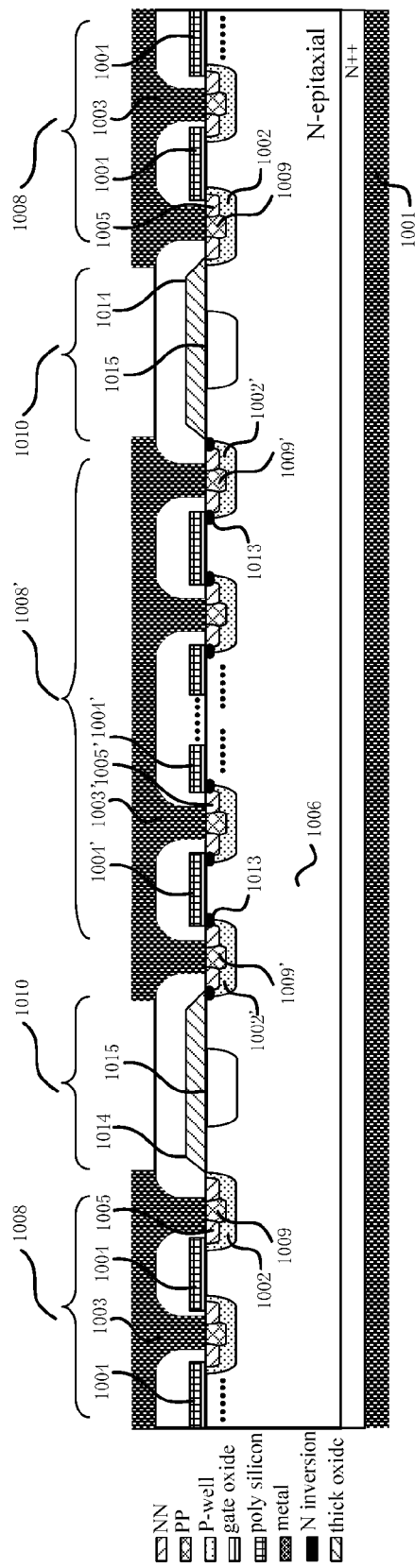
FIG. 10 is a cross-sectional view of a composite device according to a third embodiment of this invention.

Referring to FIG. 10, it shows a cross-sectional structure of a composite device according to a third embodiment. The composite device includes a cell portion 1008 of a first enhancement-mode MOS device and a cell portion 1008' of a depletion-mode MOS device, wherein both cell portions are active regions. The composite device according to the third embodiment is substantially the same as the first embodiment in structure, including an epitaxial region 1006, a first electrode 1001, a first well region 1002, a first doped region 1005, a first leading-out region 1009, a second well region 1002', a second doped region 1005', a second leading-out region 1009', a gate 1004 of the first enhancement-mode MOS device, a gate 1004' of the depletion-mode MOS device, a second electrode 1003, a third electrode 1003', and an isolator 1010.

The third embodiment is mainly different from the first embodiment in the specific structure of the isolator 1010. The isolator 1010 according to the third embodiment includes: a P-type doped floating well region 1015, which is formed in parallel with the first well region 1002 and the second well region 1002' on the front side of the epitaxial region 1006, wherein the floating well region 1015 is located between the first well region 1002 and the second well region 1002'; and a dielectric layer 1014 formed on the front side of the epitaxial region 1006, wherein the dielectric layer 1014 covers the floating well region 1015 and extends onto the epitaxial region 1006 outside the floating well region 1015. The dielectric layer 1014 may be a relatively thick oxide layer, for example.

Similar to the first embodiment or the second embodiment, the floating well region 1015 may be formed with the same or different implantation process as the first well region 1002 and the second well region 1002'. For example, the floating well region 1015 may be formed by a dopant implantation process for forming a voltage division ring or a dopant implantation process of other concentrations.

Fourth Embodiment

Figure 11:
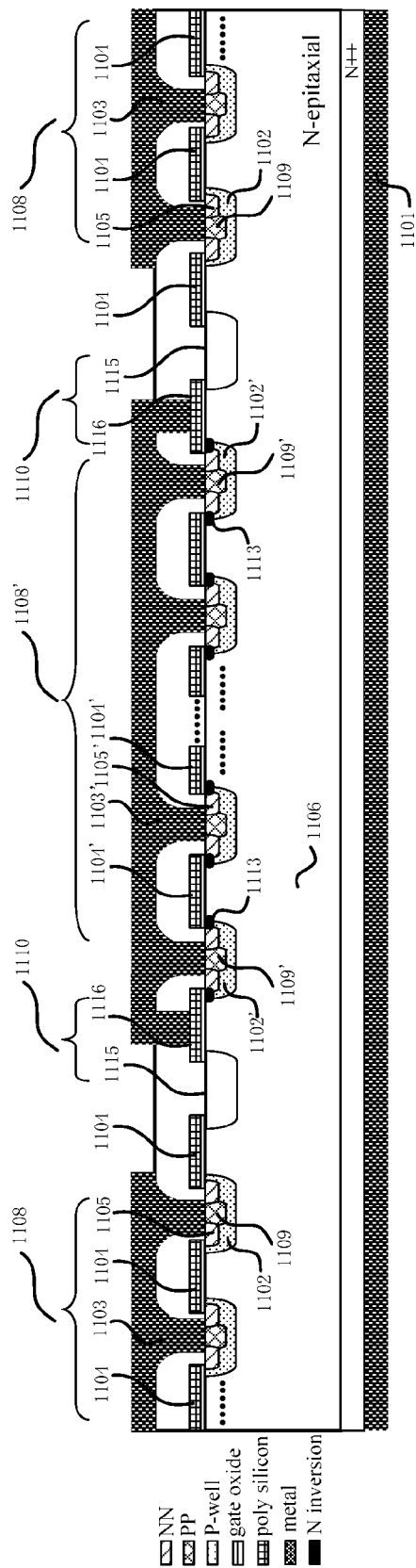
FIG. 11 is a cross-sectional view of a composite device according to a fourth embodiment of this invention.

Referring to FIG. 11, it shows a cross-sectional structure of a composite device according to a fourth embodiment. The composite device includes a cell portion 1108 of a first enhancement-mode MOS device and a cell portion 1108' of a depletion-mode MOS device, wherein both cell portions are active regions. The composite device according to the fourth embodiment is substantially the same as the first embodiment in structure, including an epitaxial region 1106, a first electrode 1101, a first well region 1102, a first doped region 1105, a first leading-out region 1109, a second well region 1102', a second doped region 1105', a second leading-out region 1109', a gate 1104 of the first enhancement-mode MOS device, a gate 1104' of the depletion-mode MOS device, a second electrode 1103, a third electrode 1103', and an isolator 1110.

The fourth embodiment is mainly different from the first embodiment in the internal structure of the isolator 1110. The isolator 1110 includes: a P-type doped floating well region 1115, which is formed in parallel with the first well region 1102 and the second well region 1102' on the front side of the epitaxial region 1106, wherein the floating well region 1115 is located between the first well region 1102 and the second well region 1102'; and a second gate 1116 formed on the front side of the epitaxial region 1106, wherein the second gate 1116 covers at least a portion of the floating well region 1115 and at least a portion of the second well region 1102', the second gate 1116 further covers the epitaxial region 1106 between the floating well region 1115 and the second well region 1102', wherein the second gate 1116 and the second well region 1102' are shorted, e.g., shorted via the third electrode 1103'.

Similar to the third embodiment, the floating well region 1115 may be formed with the same or different implantation process as the first well region 1102 and the second well region 1102'. For example, the floating well region 1115 may be formed by a dopant implantation process for forming a voltage division ring or a dopant implantation process of other concentrations.

It should be noted that, the above variations of the second, third and fourth embodiments relative to the first embodiment may be combined, and the combination falls within the scope of this application.

Fifth Embodiment

Devices integrated into the composite device according to this invention are not limited to one enhancement-mode MOS device and one depletion-mode MOS device, but may comprise three or more devices.

A composite device according to the fifth embodiment integrates therein a second enhancement-mode MOS device, in addition to the first enhancement-mode MOS device and the depletion-mode MOS device. Still referring to FIG. 6, taking an N-type device as an example again, after adding the second enhancement-mode MOS device, the epitaxial region 606 may act as a drain of the second enhancement-mode MOS device. A third P-type doped well region may be formed on the front side of the epitaxial region 606, and a third N-type doped region may be formed in the third P-type doped well region, wherein the third doped region may act as a source of the second enhancement-mode MOS device. The second enhancement-mode MOS device also has a gate on the front side of the epitaxial region 606, wherein the gate covers at least a portion of the third doped region and extends onto the epitaxial region 606 outside the third well region. The gate of the second enhancement-mode MOS device and the gate 604 of the first enhancement-mode MOS device are electrically coupled. Further, the third well region and the third doped region may be shorted via a fourth electrode, which is formed on the front side of the epitaxial region 606.

Figure 12:
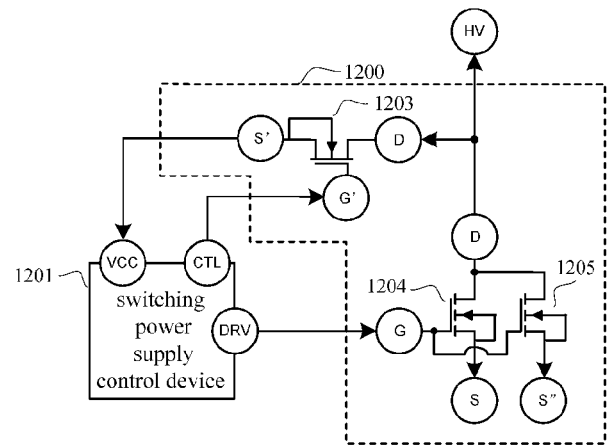
FIG. 12 is a circuit schematic diagram of a switching power supply according to a fifth embodiment of this invention.

Referring to FIG. 12, it shows a circuit structure of a switching power supply according to a fifth embodiment. The switching power supply includes a composite device 1200 and a switching power supply control device 1201. The composite device 1200 integrates therein an enhancement-mode MOS device 1204, an enhancement-mode MOS device 1205, and a depletion-mode MOS device 1203.

Further, the enhancement-mode MOS device 1204 and the enhancement-mode MOS device 1205 have their drains D being shorted and coupled to a high-voltage terminal HV; the enhancement-mode MOS device 1204 and the enhancement-mode MOS device 1205 have their gates G being shorted and coupled to a driving terminal DRV of the switching power supply control device 1201. The depletion-mode MOS device 1203 has a drain D' also coupled to the high-voltage terminal HV, and the depletion-mode MOS device 1203 has a gate G' and a source S' coupled to a control terminal CTL and a power supply terminal VCC of the switching power supply control device 1201, respectively.

The operation principles of the enhancement-mode MOS device 1204 and the depletion-mode MOS device 1203 are the same as that of the enhancement-mode MOS device 804 and the depletion-mode MOS device 803 in FIG. 8, and will not be repeated here.

The enhancement-mode MOS device 1205 and the enhancement-mode MOS device 1204 have their gates G being shorted together and their drains D being shorted together, such that the driving terminal DRV may drive both devices concurrently. When the two devices are turned on, currents of the two devices flow out from the sources S and S", respectively. Since the current of a MOS device is proportional to an area of the active region thereof, it is possible to set an area ratio of active regions of the enhancement-mode MOS device 1205 and the enhancement-mode MOS device 1204 as 1:N (e.g., N may be a positive integer), such that the enhancement-mode MOS device 1205 may generate a current which is 1/N of the current of the enhancement-mode MOS device 1204. In system application, these currents may be utilized for current sampling design.

Figure 13:
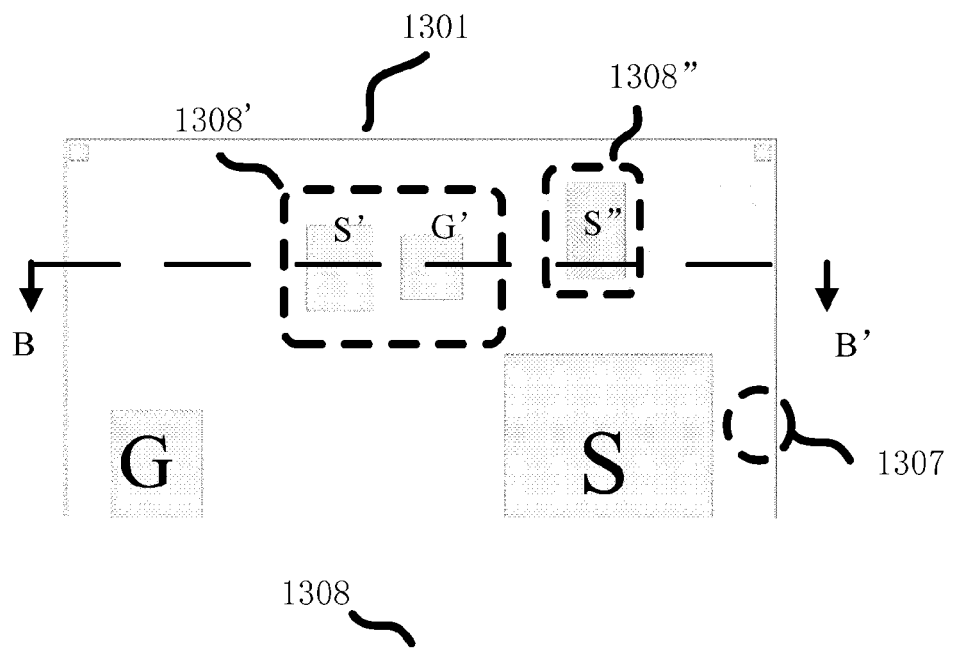
FIG. 13 is a layout schematic diagram of the composite device according to the fifth embodiment of this invention.

FIG. 13 shows a layout 1301 of the composite device 1200 in FIG. 12. On a front side of the layout 1301, there are the gates G of the enhancement-mode MOS device 1205 and the enhancement-mode MOS device 1204, the source S of the enhancement-mode MOS device 1204, the source S" of the enhancement-mode MOS device 1205, as well as the source S' and the gate G' of the depletion-mode MOS device 1203. The drains of the composite device are located on a back side of the layout 1301. Region 1308' is the active region of the depletion-mode MOS device 1203; region 1308" is the active region of the enhancement-mode MOS device 1205, and region 1308 is the active region of the enhancement-mode MOS transistor 1204.

Figure 14:
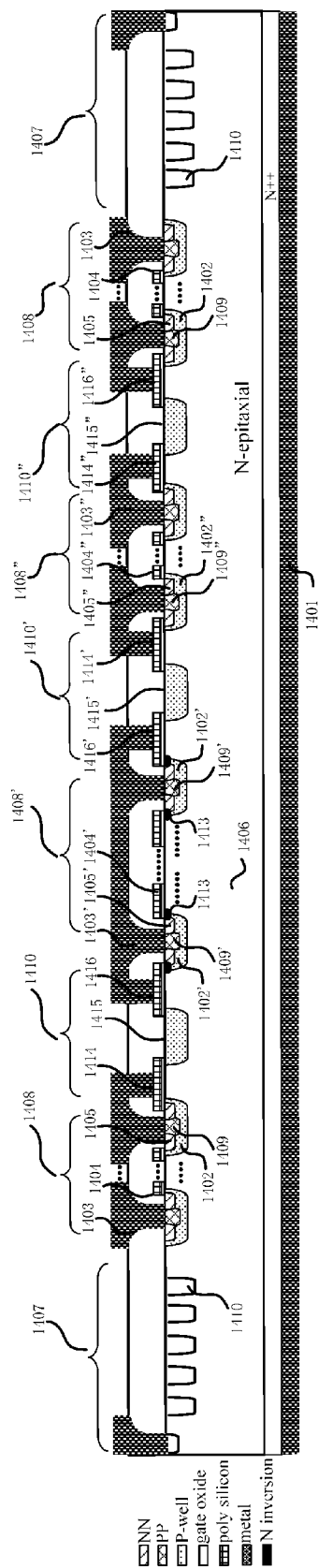
FIG. 14 is a cross-sectional view along a direction BB' in FIG. 13.

Referring to FIG. 14, it shows a longitudinal cross-sectional view along a direction BB' in FIG. 13.

The composite device includes a cell portion 1408 of a first enhancement-mode MOS device, a cell portion 1408' of a depletion-mode MOS device, and a cell portion 1408" of a second enhancement-mode MOS device, wherein the three cell portions are active regions. Taking an N-type device as an example, the composite device may include: an N-type doped epitaxial region 1406, wherein a first electrode 1401 is located on a back side of the epitaxial region 1406, and the epitaxial region 1406 and the first electrode 1401 are shorted to form the drains of the first enhancement-mode MOS device, the depletion-mode MOS device and the second enhancement-mode MOS device; a first well region 1402, a second well region 1402' and a third well region 1402" of P-type doping formed on the front side of the epitaxial region 1406; a first N-type doped region 1405 formed within the first well region 1402; a second N-type doped region 1405' formed within the second well region 1402'; a third N-type doped region 1405" formed within the third well region 1402"; an N-type doped channel region 1413 located within the second well region 1402', wherein the channel region 1413 extends from a boundary of the second well region 1402' to a boundary of the second doped region 1405'; a gate 1404 of the first enhancement-mode MOS device formed on the front side of the epitaxial region 1406, wherein the gate 1404 of the first enhancement-mode MOS device covers at least a portion of the first doped region 1405 and extends onto the epitaxial region 1406 outside the first well region 1402; a gate 1404' of the depletion-mode MOS device formed on the front side of the epitaxial region 1406, wherein the gate 1404' of the depletion-mode MOS device covers the channel region 1413 and extends onto the epitaxial region 1406 outside the second well region 1402'; a gate 1404" of the second enhancement-mode MOS device formed on the front side of the epitaxial region 1406, wherein the gate 1404" of the second enhancement-mode MOS device covers at least a portion of the third doped region 1405" and extends onto the epitaxial region 1406 outside the third well region 1402"; a first P-type doped leading-out region 1409, which is formed in parallel with the first doped region 1405 in the first well region 1402; a second P-type doped leading-out region 1409', which is formed in parallel with the second doped region 1405' in the second well region 1402'; a third P-type doped leading-out region 1409", which is formed in parallel with the third doped region 1405" in the third well region 1402".

The first well region 1402, the first leading-out region 1409 and the first doped region 1405 are shorted via a second electrode 1403, to form a source of the first enhancement-mode MOS device. The second well region 1402', the second leading-out region 1409' and the second doped region 1405' are shorted via a third electrode 1403', to form a source of the depletion-mode MOS device. The third well region 1402", the third leading-out region 1409" and the third doped region 1405" are shorted via a fourth electrode 1403", to form a source of the second enhancement-mode MOS device.

The gate 1404 of the first enhancement-mode MOS device, the gate 1404' of the depletion-mode MOS device, and the gate 1404" of the second enhancement-mode MOS device may each include a gate dielectric layer and a gate electrode on the gate dielectric layer. The gate electrode may be a polysilicon gate electrode, for example.

The composite device may further integrate therein an isolator 1410 to isolate the first enhancement-mode MOS device from the depletion-mode MOS device, wherein the isolator 1410 may be located between the cell portion 1408 of the first enhancement-mode MOS device and the cell portion 1408' of the depletion-mode MOS device. Further, the isolator 1410 may include: a P-type doped floating well region 1415, wherein the floating well region 1415 is formed in parallel with the first well region 1402 and the second well region 1402' on the front side of the epitaxial region 1406, and the floating well region 1415 is located between the first well region 1402 and the second well region 1402'; a first gate 1414 formed on the front side of the epitaxial region 1406, wherein the first gate 1414 covers at least a portion of the floating well region 1415 and at least a portion of the first well region 1402, the first gate 1414 further covers the epitaxial region 1406 between the floating well region 1415 and the first well region 1402; and a second gate 1416 formed on the front side of the epitaxial region 1406, wherein the second gate 1416 covers at least a portion of the floating well region 1415 and at least a portion of the second well region 1402', the second gate 1416 further covers the epitaxial region 1406 between the floating well region 1415 and the second well region 1402'. The first gate 1414 and the first well region 1402 are shorted, e.g., shorted via the second electrode 1403, but are not so limited; the second gate 1416 and the second well region 1402' are shorted, e.g., shorted via the third electrode 1403', but are not so limited.

The composite device may also integrate therein an isolator 1410' to isolate the depletion-mode MOS device from the second enhancement-mode MOS device. The isolator 1410' may be located between the cell portion 1408" of the second enhancement-mode MOS device and the cell portion 1408' of the depletion-mode MOS device. The isolator 1410' may include: a P-type doped floating well region 1415', wherein the floating well region 1415' is formed in parallel with the third well region 1402" and the second well region 1402' on the front side of the epitaxial region 1406, and the floating well region 1415' is located between the third well region 1402" and the second well region 1402'; a third gate 1414' formed on the front side of the epitaxial region 1406, wherein the third gate 1414' covers at least a portion of the floating well region 1415' and at least a portion of the third well region 1402", the third gate 1414' further covers the epitaxial region 1406 between the floating well region 1415' and the third well region 1402"; and a fourth gate 1416' formed on the front side of the epitaxial region 1406, wherein the fourth gate 1416' covers at least a portion of the floating well region 1415' and at least a portion of the second well region 1402', the fourth gate 1416' further covers the epitaxial region 1406 between the floating well region 1415' and the second well region 1402'. The third gate 1414' and the third well region 1402" are shorted, e.g., shorted via the fourth electrode 1403", but are not so limited; the fourth gate 1416' and the second well region 1402' are shorted, e.g., shorted via the third electrode 1403', but are not so limited.

The composite device may also integrate therein an isolator 1410" to isolate the first enhancement-mode MOS device from the second enhancement-mode MOS device. The isolator 1410" may be located between the cell portion 1408" of the second enhancement-mode MOS device and the cell portion 1408 of the first enhancement-mode MOS device. The isolator 1410" may include: a P-type doped floating well region 1415", wherein the floating well region 1415" is formed in parallel with the third well region 1402" and the first well region 1402 on the front side of the epitaxial region 1406, and the floating well region 1415" is located between the third well region 1402" and the first well region 1402; a fifth gate 1414" formed on the front side of the epitaxial region 1406, wherein the fifth gate 1414" covers at least a portion of the floating well region 1415" and at least a portion of the third well region 1402", the third gate 1414" further covers the epitaxial region 1406 between the floating well region 1415" and the third well region 1402"; and a sixth gate 1416" formed on the front side of the epitaxial region 1406, wherein the sixth gate 1416" covers at least a portion of the floating well region 1415" and at least a portion of the first well region 1402, the sixth gate 1416" further covers the epitaxial region 1406 between the floating well region 1415" and the first well region 1402. The fifth gate 1414" and the third well region 1402" are shorted, e.g., shorted via the fourth electrode 1403", but are not so limited; the sixth gate 1416' and the first well region 1402 are shorted, e.g., shorted via the second electrode 1403, but are not so limited.

The floating well region 1415, the floating well region 1415' and the floating well region 1415" may be formed by the same implantation process as the first well region 1402, the second well region 1402' and the third well region 1402". The first gate 1414, the second gate 1416, the third gate 1414', the fourth gate 1416', the fifth gate 1414", and the sixth gate 1416" may each include a gate dielectric layer and a gate electrode on the gate dielectric layer. The gate electrode may be a polysilicon gate electrode, for example.

There may be a high-voltage ring 1407 in an area outside the cell portion 1408 of the first enhancement-mode MOS device, the cell portion 1408' of the depletion-mode MOS device and the cell portion 1408" of the second enhancement-mode MOS device, wherein the high-voltage ring 1407 may include a plurality of P-type doped regions 1410, and may correspond to the region 1307 shown in FIG. 13.

In connection with FIG. 13 and FIG. 14, the three devices above may be located within the same high-voltage ring 1407, which has the same structure as the high-voltage ring for the enhancement-mode MOS device or the depletion-mode MOS device. Depending on specific applications, the requirements on the currents of the devices may vary, and the area of the active regions 1308, 1308' and 1308" may be adjusted accordingly, in order to meet the requirements of the practical applications.

Sixth Embodiment

As the application and development of products, it may subsequently tend to have lower and lower system operating voltages. When the requirements on the isolation withstand voltage are relaxed, e.g., below 10V, the structure of the composite device above may be further simplified.

Figure 15:
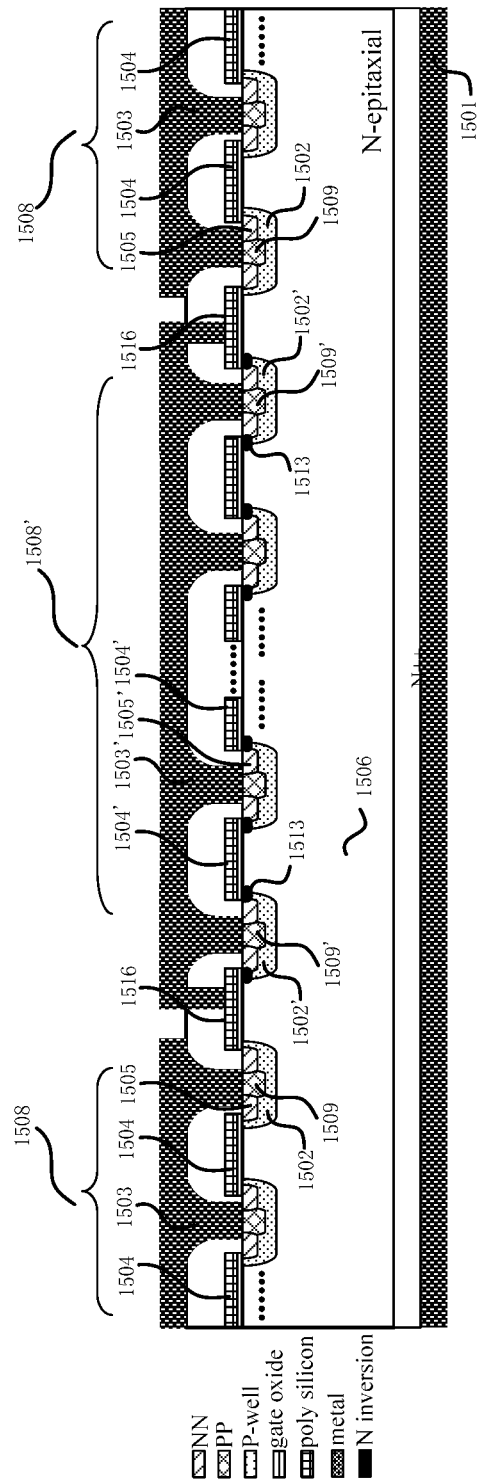
FIG. 15 is a cross-sectional view of a composite device according to a sixth embodiment of this invention.

Referring to FIG. 15, it shows a cross-sectional structure view of a composite device with the system operating voltage being decreased. The composite device includes a cell portion 1508 of a first enhancement-mode MOS device and a cell portion 1508' of a depletion-mode MOS device, wherein both cell portions are active regions. This composite device is substantially the same as the first embodiment in structure, including an epitaxial region 1506, a first electrode 1501, a first well region 1502, a first doped region 1505, a first leading-out region 1509, a second well region 1502', a second doped region 1505', a second leading-out region 1509', a gate 1504 of the first enhancement-mode MOS device, a gate 1504' of the depletion-mode MOS device, a second electrode 1503, and a third electrode 1503'.

This embodiment is mainly different from the first embodiment in the specific structure of the isolator. The isolator according to this embodiment does not include the floating well region and the first gate, while retaining only the second gate 1516 formed on the front side of the epitaxial region 1506. The second gate 1516 covers at least a portion of the first well region 1502 and at least a portion of the second well region 1502', and the second gate 1516 further covers the epitaxial region 1506 between the first well region 1502 and the second well region 1502'. The second gate 1516 and the second well region 1502' are shorted, e.g., shorted via the third electrode 1503', but are not so limited.

As compared with the first embodiment, the composite device may further simplify the isolator, to save the area of the composite device and reduce the cost.

The embodiment shown in FIG. 15 results from variation based on the first embodiment, wherein the floating well region and the first gate in the isolator are omitted. It should be noted that, the isolator may also be applied to other embodiments above, as desired.

In addition, as another variation of the isolator, based on the first embodiment, the floating well region and the second gate may be omitted in the isolator, while only the first gate is retained. More particularly, the isolator may include: the first gate formed on the front side of the epitaxial region, wherein the first gate covers at least a portion of the first well region and at least a portion of the second well region, the first gate further covers the epitaxial region between the first well region and the second well region. The first gate and the first well region are shorted, e.g., shorted via the second electrode, but are not so limited.

Similar to the isolator shown in FIG. 15, the isolator variation above may also be applied to other embodiments above.

It should be noted that, the doping types of the various doped regions in the above embodiments are illustrated by taking an N-type device as an example. However, those skilled in the art will understand, the doping types of the various doped regions may be inversed for a P-type device. In the various embodiments above, the first enhancement-mode MOS device and the second enhancement-mode MOS device are preferably VDMOS devices.

Additionally, the composite device may include one or more first enhancement-mode MOS devices, second enhancement-mode MOS device and depletion-mode MOS device.

The foregoing is merely preferred embodiments of this invention and is not intended to be limiting to this invention in any manner. Therefore, any contents without departing from the solutions of this invention, and any simply modifications, equivalents and alternations to the above embodiments according to the spirit of this invention fall within the scope of this invention.

What is claimed is:

1. A composite device in which a first enhancement-mode MOS device and a depletion-mode MOS device are integrated, comprising:
    an epitaxial region of a first doping type, wherein the epitaxial region acts as drains of the first enhancement-mode MOS device and the depletion-mode MOS device;
    a first well region and a second well region formed in parallel on a front side of the epitaxial region, wherein the first well region and the second well region have a second doping type opposite to the first doping type;
    a first doped region of the first doping type formed within the first well region, wherein the first doped region acts as a source of the first enhancement-mode MOS device;
    a gate of the first enhancement-mode MOS device formed on the front side of the epitaxial region, wherein the gate of the first enhancement-mode MOS device covers at least a portion of the first doped region and extends onto the epitaxial region outside the first well region; a second doped region of the first doping type formed within the second well region, wherein the second doped region acts as a source of the depletion-mode MOS device;
    a channel region of the first doping type located within the second well region, wherein the channel region extends from a boundary of the second well region to a boundary of the second doped region; and
    a gate of the depletion-mode MOS device formed on the front side of the epitaxial region, wherein the gate of the depletion-mode MOS device covers the channel region and extends onto the epitaxial region outside the second well region;
    wherein the epitaxial region is shorted to a first electrode formed on a back side of the epitaxial region, the first well region and the first doped region are shorted via a second electrode, the second well region and the second doped region are shorted via a third electrode, wherein the second electrode and the third electrode are formed on the front side of the epitaxial region.

2. The composite device of claim 1, further comprising an isolator for isolating the first enhancement-mode MOS device from the depletion-mode MOS device, wherein the isolator comprises:
    a floating well region of the second doping type, wherein the floating well region is formed in parallel with the first well region and the second well region on the front side of the epitaxial region, and the floating well region is located between the first well region and the second well region;
    a first gate formed on the front side of the epitaxial region, wherein the first gate covers at least a portion of the floating well region and at least a portion of the first well region, the first gate further covers the epitaxial region between the floating well region and the first well region; and
    a second gate formed on the front side of the epitaxial region, wherein the second gate covers at least a portion of the floating well region and at least a portion of the second well region, and the second gate further covers the epitaxial region between the floating well region and the second well region;
    wherein the first gate and the first well region are shorted, and the second gate and the second well region are shorted.

3. The composite device of claim 2, wherein the first gate and the first well region are shorted via the second electrode, and the second gate and the second well region are shorted via the third electrode.

4. The composite device of claim 2, wherein the floating well region is formed with a same or different implantation process as the first well region and the second well region.

5. The composite device of claim 1, further comprising an isolator for isolating the first enhancement-mode MOS device from the depletion-mode MOS device, wherein the isolator comprises:
- a floating well region of the second doping type, wherein the floating well region is formed in parallel with the first well region and the second well region on the front side of the epitaxial region, and the floating well region is located between the first well region and the second well region; and
- a dielectric layer formed on the front side of the epitaxial region, wherein the dielectric layer covers the floating well region and extends onto the epitaxial region outside the floating well region.

6. The composite device of claim 1, further comprising an isolator for isolating the first enhancement-mode MOS device from the depletion-mode MOS device, wherein the isolator comprises:
a floating well region of the second doping type, wherein the floating well region is formed in parallel with the first well region and the second well region on the front side of the epitaxial region, and the floating well region is located between the first well region and the second well region; and
- a second gate formed on the front side of the epitaxial region, wherein the second gate covers at least a portion of the floating well region and at least a portion of the second well region, and the second gate further covers the epitaxial region between the floating well region and the second well region, wherein the second gate and the second well region are shorted.

7. The composite device of claim 6, wherein the second gate and the second well region are shorted via the third electrode.

8. The composite device of claim 1, further comprising an isolator for isolating the first enhancement-mode MOS device from the depletion-mode MOS device, wherein the isolator comprises:
- a second gate formed on the front side of the epitaxial region, wherein the second gate covers at least a portion of the first well region and at least a portion of the second well region, and the second gate further covers the epitaxial region between the first well region and the second well region, wherein the second gate and the second well region are shorted.

9. The composite device of claim 8, wherein the second gate and the second well region are shorted via the third electrode.

10. The composite device of claim 1, further comprising an isolator for isolating the first enhancement-mode MOS device from the depletion-mode MOS device, wherein the isolator comprises:
- a first gate formed on the front side of the epitaxial region, wherein the first gate covers at least a portion of the first well region and at least a portion of the second well region, and the first gate further covers the epitaxial region between the first well region and the second well region, wherein the first gate and the first well region are shorted.

11. The composite device of claim 10, wherein the first gate and the first well region are shorted via the second electrode.

12. The composite device of claim 1, wherein a second enhancement-mode MOS device is integrated in the composite device, wherein:
the epitaxial region acts as a drain of the second enhancement-mode MOS device;
a third well region is formed on the front side of the epitaxial region, wherein the third well region has the second doping type, and the third well region is parallel with the first well region and the second well region;
a third doped region of the first doping type is formed within the third well region, wherein the third doped region acts as a source of the second enhancement-mode MOS device; and
a gate of the second enhancement-mode MOS device is formed on the front side of the epitaxial region, wherein the gate of the second enhancement-mode MOS device covers at least a portion of the third doped region and extends onto the epitaxial region outside the third well region, and the gate of the second enhancement-mode MOS device is electrically coupled to the gate of the first enhancement-mode MOS device;
wherein the third well region and the third doped region are shorted via a fourth electrode, which is formed on the front side of the epitaxial region.

13. The composite device of claim 1, further comprising:
- a first leading-out region of the second doping type formed within the first well region, wherein the first leading-out region and the first doped region are shorted via the second electrode; and
- a second leading-out region of the second doping type formed within the second well region, wherein the second leading-out region and the second doped region are shorted via the third electrode.

14. The composite device of claim 1, wherein the first enhancement-mode MOS device and the depletion-mode MOS device share a common high-voltage ring.

15. The composite device of claim 1, wherein one or more first enhancement-mode MOS devices are integrated in the composite device, and one or more depletion-mode MOS devices are integrated in the composite device.

16. A switching power supply, comprising the composite device of claim 1.

17. The switching power supply of claim 16, comprising:
- a switching power supply control device with a power supply terminal, a control terminal and a driving terminal; and
- the composite device, wherein the gate of the first enhancement-mode MOS device in the composite device is coupled to the driving terminal of the switching power supply control device, the gate of the depletion-mode MOS device in the composite device is coupled to the control terminal of the switching power supply control device, and the source of the depletion-mode MOS device in the composite device is coupled to the power supply terminal of the switching power supply control device.

18. The switching power supply of claim 17, wherein when a voltage at the power supply terminal is lower than a preset turn-off voltage, the switching power supply control device controls the depletion-mode MOS device in the composite device to supply a startup current to the power supply terminal; when the voltage at the power supply terminal rises above a preset turn-on voltage, the switching power supply control device controls the first enhancement-mode MOS device in the composite device to provide a power output current to a main circuit in the switching power supply, and controls the depletion-mode MOS device in the composite device to cut off the startup current.

* * * * *